(12) United States Patent
Saitoh et al.

(10) Patent No.: US 9,647,193 B2
(45) Date of Patent: May 9, 2017

(54) THERMOELECTRIC CONVERSION ELEMENT AND THERMOELECTRIC CONVERSION DEVICE

(75) Inventors: Eiji Saitoh, Miyagi (JP); Ken-ichi Uchida, Miyagi (JP)

(73) Assignee: TOHOKU TECHNOARCH CO., LTD., Sendai-shi (JP)

( * ) Notice: Subject to any disclaimer, the term of this patent is extended or adjusted under 35 U.S.C. 154(b) by 0 days.

(21) Appl. No.: 13/283,825

(22) Filed: Oct. 28, 2011

(65) Prior Publication Data

US 2013/0104948 A1    May 2, 2013

(51) Int. Cl.
H01L 35/00 (2006.01)
H01L 37/00 (2006.01)
H01L 35/32 (2006.01)

(52) U.S. Cl.
CPC ............... *H01L 37/00* (2013.01); *H01L 35/32* (2013.01)

(58) Field of Classification Search
CPC ................................ H01L 35/32; H01L 37/00
USPC ............................................................ 136/200
See application file for complete search history.

(56) References Cited

U.S. PATENT DOCUMENTS

| | | | | |
|---|---|---|---|---|
| 5,419,780 A | * | 5/1995 | Suski ...................... | H01L 23/38 136/201 |
| 2011/0084349 A1 | * | 4/2011 | Uchida ............... | C01G 49/0054 257/421 |

FOREIGN PATENT DOCUMENTS

| | | |
|---|---|---|
| JP | 2007-165463 A | 6/2007 |
| JP | 2009-130070 A | 6/2009 |
| WO | 2009/151000 A1 | 12/2009 |
| WO | WO 2009151000 A1 * | 12/2009 ......... C01G 49/0054 |

OTHER PUBLICATIONS

Uchida et al., "Observation of longitudinal spin-Seebeck effect in magnetic insulators", Applied Physics Letters 97, 172505 (2010).*
Kajiwara et al., "Transmission of electrical signals by spin-wave interconversion in a magnetic insulator", Nature Letters, vol. 464, pp. 262-267 (Mar. 11, 2010).*

(Continued)

*Primary Examiner* — Luan Van
*Assistant Examiner* — Angelo Trivisonno
(74) *Attorney, Agent, or Firm* — Westerman, Hattori, Daniels & Adrian, LLP

(57) ABSTRACT

[Object] To increase the degree of freedom in designing a system for taking out power from a temperature gradient in terms of a thermoelectric conversion element or a thermoelectric conversion device.
[Means for Achieving Object] A thermal spin-wave spin current generating member made of a magneto-dielectric body is provided with an inverse spin Hall effect member, a temperature gradient is provided in the above-described thermal spin-wave spin current generating member in the direction of the thickness, and at the same time a magnetic field is applied to the above-described inverse spin Hall effect member in the direction perpendicular to the longitudinal direction and perpendicular to the direction of the above-described temperature gradient by means of a magnetic field applying means so that a thermal spin-wave spin current is converted to a voltage which is taken out in the above-described inverse spin Hall effect member.

10 Claims, 13 Drawing Sheets

(56) References Cited

OTHER PUBLICATIONS

K. Uchida et al. "Observation of Longitudinal spin-Seebeck effect in magnetic insulators" Applied Physics Letters, 2010, pp. 172505-1 to 172505-3, vol. 97.
K. Uchida et al. "Longitudinal spin-Seebeck effect in sintered polycrystalline (Mn, Zn) Fe2O4", Applied Physics Letters, 2010, pp. 262504-1 to 262504-3, vol. 97.
Kajiwara, Y. et al., "Transmission of electrical signals by spin-wave interconversion in a magnetic insulator", Nature, Mar. 2010, p. 262-267, vol. 464.
Saitoh, E. et al., "Conversion of spin current into charge current at room temperature: inverse spin-hall effect", Applied Physics Letters, 2006, vol. 88.
Silsbee, R.H. et al., "Coupling between ferromagnetic and conduction-spin-resonance modes at a ferromagnetic-normal-metal interface", The American Physical Society, May 1979, p. 4382-4399, vol. 19.

* cited by examiner

Fig. 1
(a) 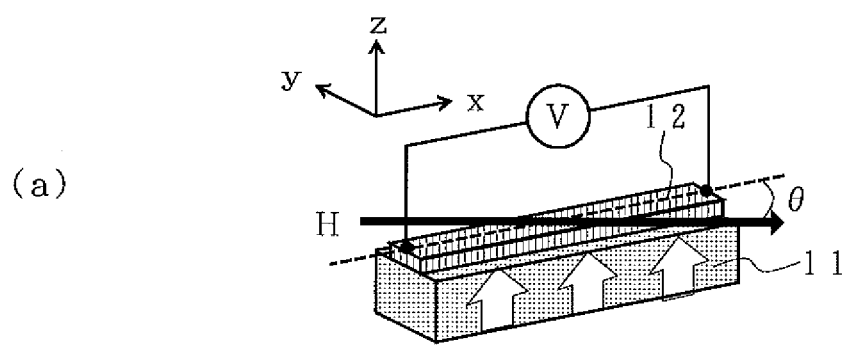
(b) 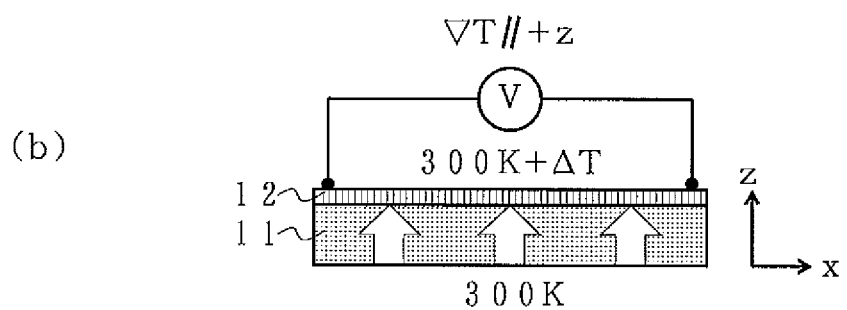
(c) 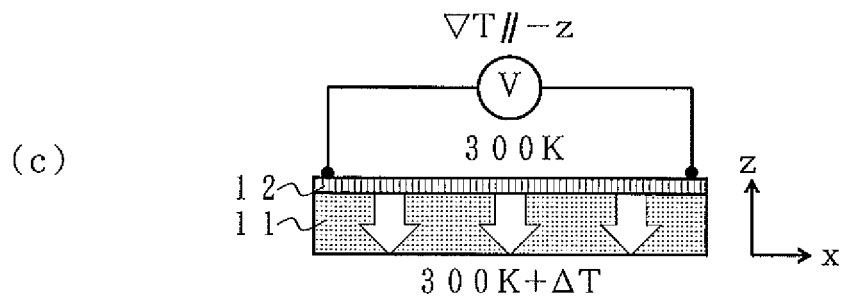

Fig. 5
(a) 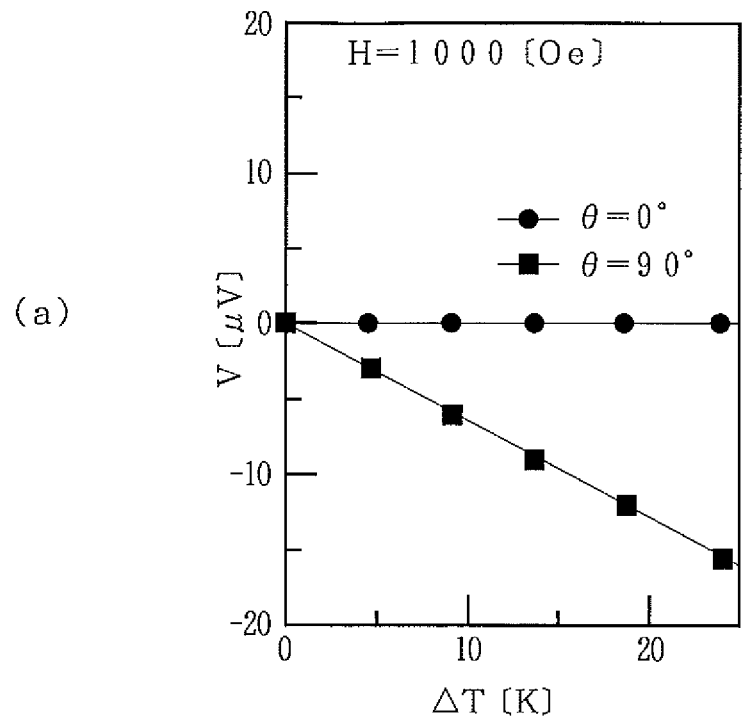
(b) 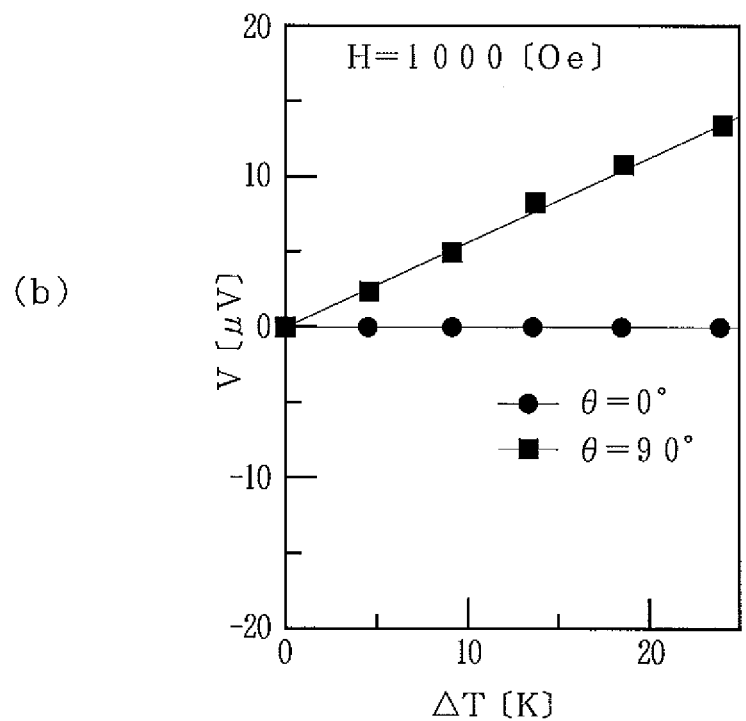

Fig. 8
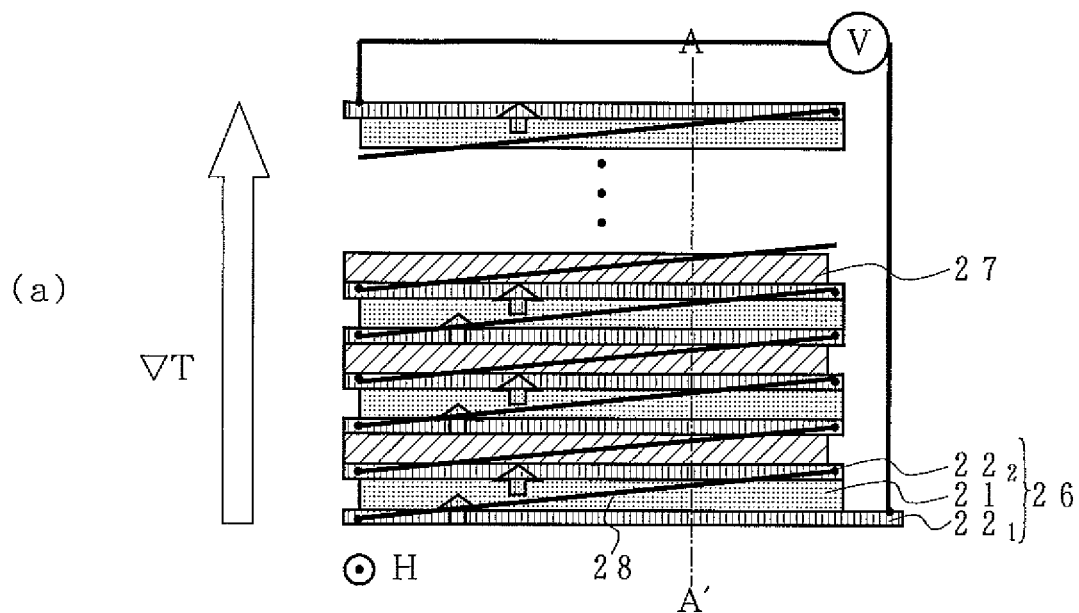
(a)
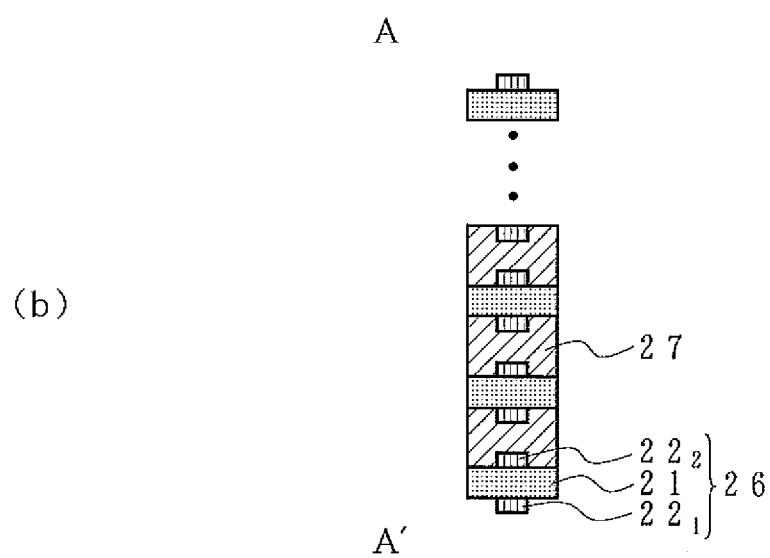
(b)

Fig. 10
(a)
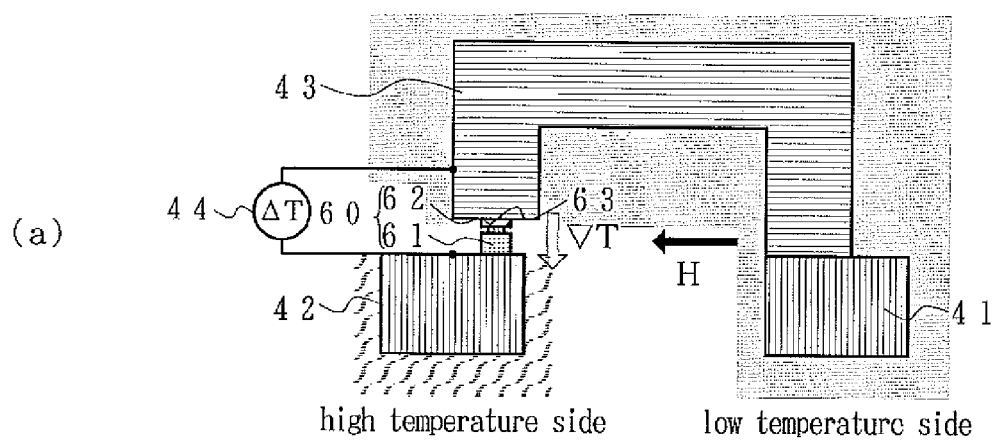
high temperature side    low temperature side
(b)
(c)
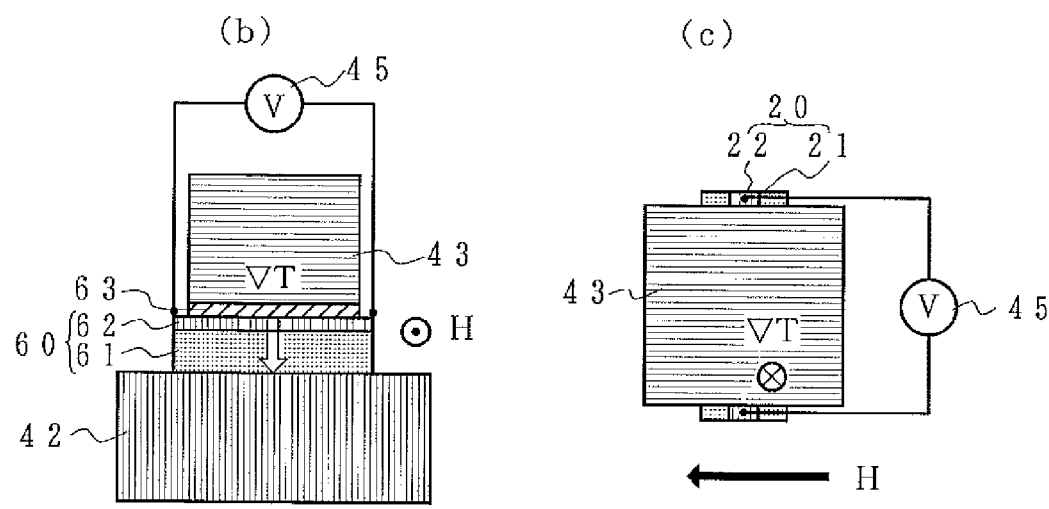

Fig. 11
(a) 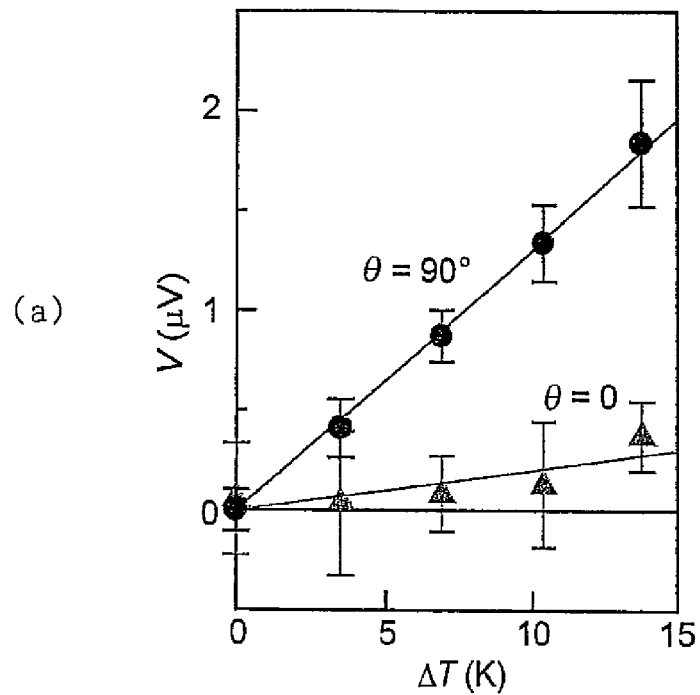
(b) 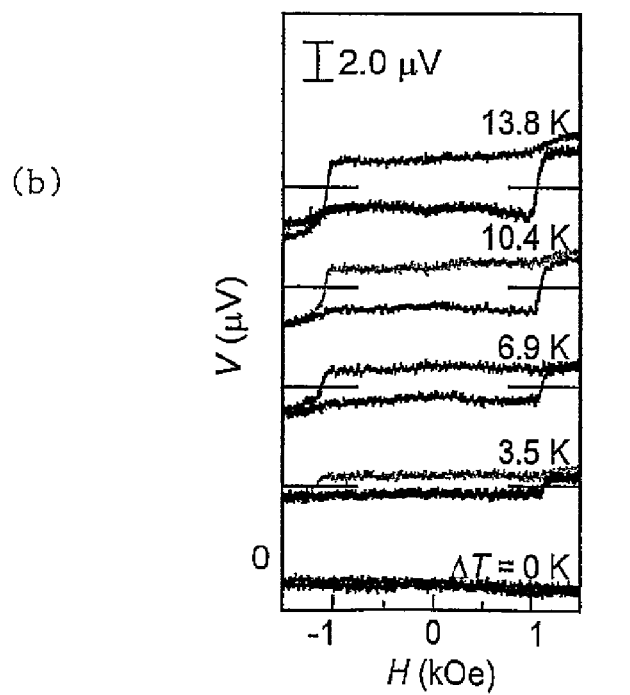

spin-wave spin current

THERMOELECTRIC CONVERSION ELEMENT AND THERMOELECTRIC CONVERSION DEVICE

TECHNICAL FIELD

The present invention relates to a thermoelectric conversion element and a thermoelectric conversion device, and in particular to a thermoelectric conversion element and a thermoelectric conversion device which are characterized by the structure that can increase the degree of freedom in designing the element.

BACKGROUND ART

In recent years, the necessity of clean energy has been brought up as a measure against global warming, and the application of a thermoelectric affect is expected as the clean energy source. For example, the use of Seebeck effect elements has been proposed for the conversion of waste heat from thermal power plants, factories and automobiles to electric power (see Patent Document 1).

However, the efficiency of the current Seebeck effect elements is not sufficiently high, and a further increase in the efficiency of the thermoelectric conversion is required in order to put the Seebeck effect elements into practice as the clean energy source.

The figure of merit Z, which is an indicator of the efficiency in the thermoelectric conversion of a current Seebeck effect element where a dissimilar metal joint made of two types of metals having different Seebeck coefficients is used, can be represented by:

$$Z = S^2 \times (\sigma/\kappa) \quad (1)$$

when S is a Seebeck coefficient, $\sigma$ is the electric conductivity and $\kappa$ is the thermal conductivity. In addition, the direction in which the electromotive force V is generated is parallel to the direction of the temperature gradient $\nabla T$.

In this case, the Seebeck coefficient S, the electric conductivity $\sigma$ and the thermal conductivity $\kappa$ are all values inherent to the substance, and therefore the figure of merit Z is also a value inherent to the substance, and thus a thermoelectric conversion element having a high figure of merit Z is necessary in order to implement a highly efficient thermoelectric power generation. As a result, it is necessary to develop a new substance in order to increase the figure of merit Z.

Meanwhile, the degree of freedom of the electron charge that is currently used in the field of electronics, such as for semiconductor devices, may be substituted with the degree of freedom of spins that electrons have in addition to their charges, that is to say, the degree of freedom of the spin angular momentum, which is used in spintronics, and this attracts attention as a carrier of the next generation electronic technologies.

By using spintronics where the degree of freedom in the electron charges and the spins is used simultaneously, the aim is to gain performance and characteristics not yet available, and a major part of the spintronics devices is driven by a spin current.

A spin current has little dissipation of energy and is therefore expected to be used for highly efficient energy transfer, and thus it has been urgently demanded to establish methods for generating and detecting a spin current.

Here, spin pumping has been proposed as a method for generating a spin current (see Non-Patent Document 1), and the present inventors have proposed a use of the inverse spin Hall effect (ISHE) as the method for detecting a spin current (see Non-Patent Document 2).

FIG. 12 is a diagram illustrating the inverse spin Hall effect where a pure spin current $J_S$ is injected into a sample when a current $J_C$ flows in the direction perpendicular to the direction of the pure spin current $J_S$ due to the inverse spin Hall effect. There is a potential difference V across the ends of the sample as a result of the inverse spin Hall effect, and therefore this potential difference V can be detected to make it possible to detect whether or not there is a pure spin current $J_S$.

In the thermoelectric conversion using the above-described Seebeck effect, however, the figure of merit Z is large when a substance having a high electric conductivity $\sigma$ is used, as can be seen from the formula (1). In the case of a metal, however, substances having a high electric conductivity $\sigma$ also have a high thermal conductivity $\kappa$, and therefore a problem arises such that an increase in the figure of merit Z due to an increase in the electric conductivity $\sigma$ is offset by the effects of the thermal conductivity $\kappa$.

Therefore, the present inventors have proposed a spin-Seebeck effect element where the junction between a magnetic body, such as NiFe, and a metal having a large spin-orbit interaction, such as Pt, is used (see Patent Document 2). In this spin-Seebeck effect element, a thermal spin current generated in the magnetic body, such as NiFe, due to the temperature gradient is spin exchanged in the interface with Pt, the pure spin current resulting from the exchange induces the electric current to flow in the direction perpendicular to the direction of the pure spin current, and this electric current is outputted as a voltage across the two ends of the magnetic body.

This was achieved as a result of the findings where there is a difference in the up spin current and the down spin current, which thermally generates a spin current when a temperature gradient is provided to a magnetic body, particularly a ferromagnetic body in a state where an external magnetic field is applied.

The figure of merit Z in this case can be represented by:

$$Z = S_S^2 \times (\sigma_1/\kappa_F) \quad (2)$$

where $S_S$ is the thermopower of the spin-Seebeck effect element, $\sigma_1$ is the electric conductivity of the inverse spin Hall member, and $\kappa_F$ is the thermal conductivity of the magnetic body. Unlike the conventional figure of merit, the figure of merit in this case can be changed greatly by selecting the materials for the element because the electric conductivity in the numerator and the thermal conductivity in the denominator are carried by different substances.

In this case, the direction in which the electromotive force V is generated is perpendicular to the direction of the temperature gradient $\nabla T$ because the inverse spin Hall effect is used. The thermopower $S_S$ of the spin-Seebeck effect element is proportional to the length in the direction perpendicular to the direction of the temperature gradient $\nabla T$ and is thus characterized in that the figure of merit Z can be modulated by adjusting the size of the sample, unlike in the conventional Seebeck effect elements. That is to say, the sample can be formed so as to be long in the direction perpendicular to the temperature gradient $\nabla T$ so that the electromotive force V proportional to the length can be gained.

The spin current is not a physical, conserved quantity, and therefore the above-described thermal spin current conversion can be used so that the spin current can be continuously taken out simply by providing a temperature gradient, and accordingly the thermoelectromotive force can also be continuously taken out.

In this spin-Seebeck effect element, however, the thermal spin current generating member is made of a metal having a large thermal conductivity κ, and therefore it is difficult to provide a uniform temperature gradient ∇T when the sample is made large in order to increase the electromotive force V. Accordingly, it is currently difficult to implement a thermoelectric conversion element that is industrially available using a spin-Seebeck effect element entirely made of metal.

Thus, the present inventors have proposed a spin-Seebeck effect element where a magneto-dielectric body having a small thermal conductivity, such as YIG, is used for the thermal spin current generating member instead of metal (see Patent Document 3). Here, a spin-Seebeck effect element having a magneto-dielectric body is described in reference to FIG. 13.

FIG. 13 is a schematic perspective diagram showing a spin-Seebeck effect element using a magneto-dielectric body that is provided with non-magnetic conductors 52 and 53 in strips on a magneto-dielectric layer 51. In this state, an external magnetic field H is applied in the direction of the arrow, and at the same time a uniform temperature gradient ∇T is provided, and thus pure spin currents $J_S$ in the opposite symbols respectively flow through the interfaces between the magneto-dielectric body and the non-magnetic conductor located on the high temperature side and on the low temperature side of the element. The pure spin currents $J_S$ that have been injected into the normal conductors 52 and 53 are converted to electric currents in the direction perpendicular to the temperature gradient ∇T as a result of the electron relativistic effect so that the thermoelectromotive forces $V_{ISHE}$ are generated in the opposite directions in the non-magnetic conductor 52 provided on the high temperature side and the non-magnetic conductor 53 provided on the low temperature side. That is to say, the electromotive force resulting from the inverse spin Hall effect is generated in the direction of the outer product of the injected pure spin current $J_S$ and the direction of the polarization of the spins (direction of magnetization M of the magneto-dielectric body).

Any magneto-dielectric body that contains Fe or Co can be used as the magneto-dielectric body 51, but in practice, YIG (yttrium iron garnet) and yttrium gallium iron garnet that are easily available and have small dissipation of the spin angular momentum are used, that is say, a material that can be represented by a general formula: $Y_3Fe_{5-x}Ga_xO_{12}$ (x<5) is used. In addition, it is desirable to use any of Pt, Au, Pd, Ag, Bi and elements having an f orbital as the non-magnetic conductors 52 and 53 that become inverse spin Hall effect members. These elements have a large spin-orbit interaction, and therefore the thermal spin-wave spin current and the pure spin current can be exchanged at high efficiency in the interfaces between the magneto-dielectric body 51 and the non-magnetic conductor 52 as well as between the magneto-dielectric body 51 and the non-magnetic conductor 53.

FIG. 14 is a schematic diagram illustrating a spin-wave spin current, and as shown in FIG. 14, a spin-wave spin current is provided when spin precesses around the equilibrium position and the change in the phase conveys through the spin system as a wave, and a thermal spin-wave spin current is provided when the change in the phase is caused by heat. A spin-wave spin current is characterized in that it can propagate over a long distance of several mm or several cm or more in contrast to the length of the spin diffusion of a conduction electron-based pure spin current being several nm to several hundreds of nm. This has already been confirmed through various experiments (see Non-Patent Document 3).

In this conversion between a thermal spin-wave spin current and a pure spin current, a thermal spin-wave spin current generated by the temperature gradient in a magneto-dielectric body is exchanged with a spin in a metal electrode so that a pure spin current is generated in the metal electrode, and this pure spin current generates an electric current which generates a thermoelectromotive force $V_{ISHE}$ across the two ends of the metal electrode.

PRIOR ART DOCUMENTS

Patent Documents

Patent Document 1: Japanese Unexamined Patent Publication 2007-165463
Patent Document 2: Japanese Unexamined Patent Publication 2009-130070
Patent Document 3: PCT International Publication Pamphlet WO 2009/151000

Non-Patent Documents

Non-Patent Document 1: Phys. Rev., B19, p. 4382, 1979
Non-Patent Document 2: Applied Physics Letters Vol. 88, p 182509, 2006
Non-Patent Document 3: Nature, Vol. 464, p. 262-266, 2010

SUMMARY OF THE INVENTION

Problem to be Solved by the Invention

In the case of the above-described spin-Seebeck effect element using a magneto-dielectric body as well, a temperature gradient ∇T is provided in a direction within the plane of the magneto-dielectric layer, and therefore there is a limitation in the state of contact with the heat source, and thus there is such a problem that the element cannot be made to make contact with a boiler or a chimney by being wrapped around it, and as a result practical application is limited.

Accordingly, an object of the present invention is to increase the degree of freedom in designing a system for taking out power from a temperature gradient.

Means for Solving Problem

In order to achieve the above-described object, the present invention provides a thermoelectric conversion element, wherein a thermal spin-wave spin current generating member made of a magneto-dielectric body is provided with an inverse spin Hall effect member, a temperature gradient is provided in the above-described thermal spin-wave spin current generating member in the direction of the thickness, and at the same time a magnetic field is applied to the above-described inverse spin Hall effect member in the direction perpendicular to the longitudinal direction and perpendicular to the direction of the above-described temperature gradient by means of a magnetic field applying means so that a thermal spin-wave spin current is converted to a voltage which is taken out in said inverse spin Hall effect member.

Thus, a temperature gradient is provided to the thermal spin-wave spin current generating member in the direction of the thickness so that a thermoelectromotive force can be generated in the direction perpendicular to the temperature gradient, and the degree of freedom in designing the element is increased.

In addition, a ferrimagnetic dielectric material, a ferromagnetic dielectric material or an antiferromagnetic dielectric material may be used as the magneto-dielectric body. In the case where the magneto-dielectric body is a ferrimagnetic dielectric material or a ferromagnetic dielectric material, an antiferromagneto-dielectric layer that makes contact with the magneto-dielectric body so as to fix the direction of the magnetization of the magneto-dielectric body may be provided as the magnetic field applying means.

In addition, any magneto-dielectric body that contains Fe or Co may be used as the magneto-dielectric body, and it is desirable to use garnet ferrite, spinel ferrite that can be represented by: $Mn_xZn_{1-x}Fe_2O_4$ (0<x<1), or hexagonal ferrite.

In addition, it is desirable to use any of Pt, Au, Pd, Ag, Bi, elements having an f orbital, transition metal elements having a 3d orbital, alloys of these, and alloys of any of these materials and Cu, Al or Bi to make the inverse spin Hall effect member.

A thermoelectric conversion device can be formed by alternately aligning a number of thermoelectric conversion elements, which are the same as the above-described thermoelectric conversion element, so that the direction of magnetization is opposite to each other, or aligning the number of thermoelectric conversion elements so that the direction of magnetization is the same, and at the same time connecting the ends of the inverse spin Hall effect members to each other so that the thermoelectromotive forces are connected in series.

Alternatively, a thermoelectric conversion device may be formed by providing the two sides or one side of a thermal spin-wave spin current generating member made of a magneto-dielectric body with an inverse spin Hall effect member so that a thermoelectric conversion element is formed, and layering a number of thermoelectric conversion elements, which are the same as the above-described thermoelectric conversion element, on top of each other with non-magnetic insulators in between, and at the same time connecting the ends of the above-described inverse spin Hall effect members to each other so that the thermoelectromotive forces are connected in series, and a temperature gradient is provided to the above-described thermoelectric conversion elements in the direction in which the above-described thermoelectric conversion elements are layered, and a magnetic field is applied to the above-described inverse spin Hall effect elements in the direction perpendicular to the longitudinal direction and perpendicular to the direction of the above-described temperature gradient by means of a magnetic field applying means, and thus a thermal spin-wave spin current is converted to a voltage which is taken out in the above-described inverse spin Hall effect members.

Effects of the Invention

According to the present invention, a temperature gradient is provided to the thermal spin-wave spin current generating member in the direction of the thickness, and therefore a thermoelectromotive force can be generated in the direction perpendicular to the temperature gradient, and as a result the degree of freedom in designing the element increases, and thus the number of the types of heat sources to which the element can be applied dramatically increases.

BRIEF DESCRIPTION OF THE DRAWINGS

FIGS. 1(a) to 1(c) are schematic diagrams showing the structure of the thermoelectric conversion element according to one embodiment of the present invention;

FIGS. 5(a) and 5(b) are graphs illustrating the results of measurement;

FIGS. 8(a) and 8(b) are schematic diagrams showing the structure of the thermoelectric conversion device according to Example 4 of the present invention;

FIGS. 10(a) to 10(c) are diagrams illustrating the structure of the thermoelectric conversion device according to Example 6 of the present invention;

FIGS. 11(a) and 11(b) are graphs illustrating the results of measurement in Example 6;

BEST MODE FOR CARRYING OUT THE INVENTION

Figure 2:
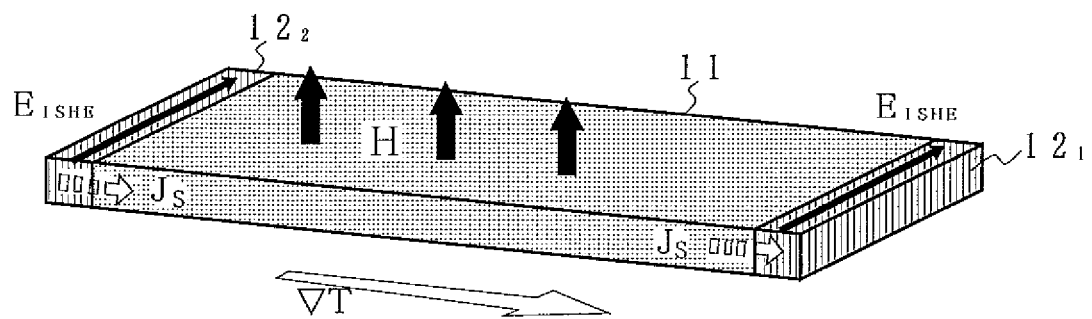
FIG. 2 is a diagram showing a modification in order to make the comparison with the structure according to the prior art easy.

Here, the embodiments of the present invention are described in reference to FIG. 1(a) to FIG. 2. FIGS. 1(a) to 1(c) are schematic diagrams showing the structure of the thermoelectric conversion element according to an embodiment of the present invention where FIG. 1(a) is a schematic perspective diagram, FIG. 1(b) is a schematic cross-sectional diagram showing a case where the inverse spin Hall effect member side is of a high temperature, and FIG. 1(c) is a schematic cross-sectional diagram showing a case where the inverse spin Hall effect member side is of a low temperature. Here, arrows in the figures indicate the direction of the heat flow.

As shown in the figures, a thermal spin-wave spin current generating member 11 made of a magneto-dielectric body is provided with an inverse spin Hall effect member 12, a temperature gradient (longitudinal direction in the figures) is provided in the thermal spin-wave spin current generating member 11 in the direction of the thickness, and at the same time a magnetic field H is applied to the inverse spin Hall effect member 12 in the direction perpendicular to the longitudinal direction by means of a magnetic field applying means so that a thermoelectromotive force V is taken out across the two ends of the inverse spin Hall effect member 12.

Figure 12:
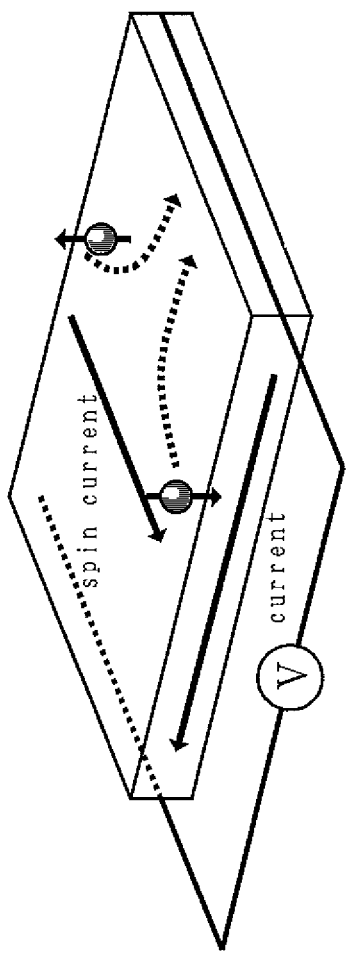
FIG. 12 is a diagram illustrating an inverse spin Hall effect.
Figure 13:
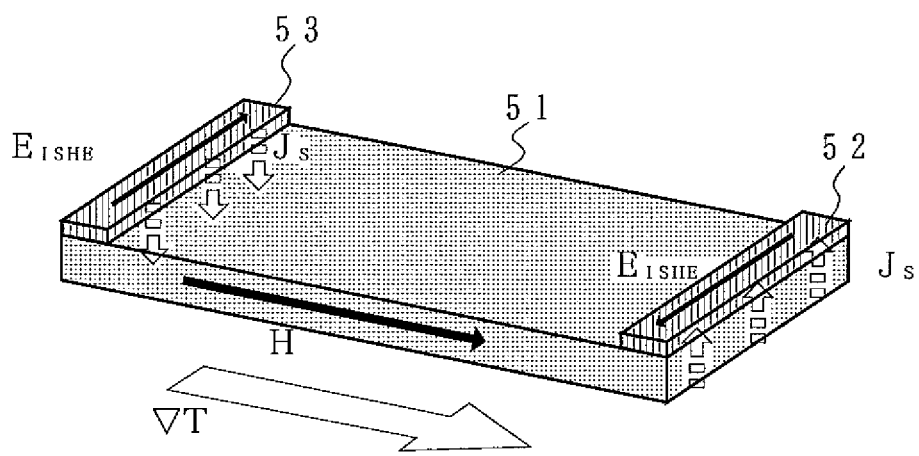
FIG. 13 is a schematic perspective diagram showing a spin-Seebeck effect element using a magneto-dielectric body.
Figure 14:
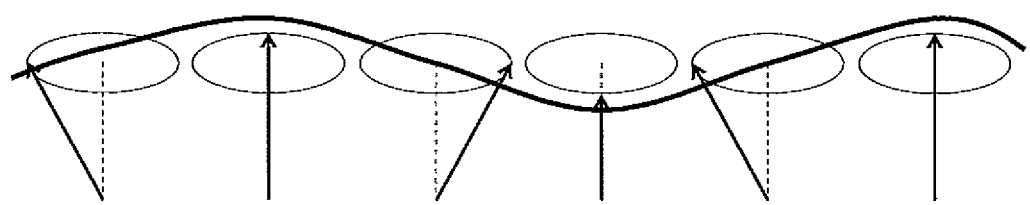
FIG. 14 is a diagram illustrating a spin-wave spin current.

FIG. 2 is a diagram showing a modification in order to make the comparison between the structure according to the present invention and the structure according to the prior art shown in FIG. 12 easy, where inverse spin Hall effect members $12_1$ and $12_2$ made of a non-magnetic conductor are provided at the two ends of the thermal spin-wave spin current generating member 11 in plate form and a temperature gradient $\nabla T$ is provided to the thermal spin-wave spin current generating member 11 in the longitudinal direction, and at the same time an external magnetic field H is applied to the thermal spin-wave spin current generating member 11 in the direction of the thickness.

At this time, the thermal spin-wave spin current $J_S$ is injected into the inverse spin Hall effect members $12_1$ and $12_2$ as a pure spin current through the exchange between the thermal spin-wave spin current and the pure spin current in the interface with the inverse spin Hall effect members $12_1$ and $12_2$.

When the pure spin current is injected, an electric current flows in the direction perpendicular to the temperature gradient as a result of the electron relativistic effect so that thermoelectromotive forces $V_{ISHE}$ are generated in the inverse spin Hall effect members $12_1$ and $12_2$ in the longitudinal direction. At this time, the direction of the thermoelectromotive forces $V_{ISHE}$ in the interfaces between the thermal spin-wave spin current generating member 11 and the two inverse spin Hall effect members $12_1$ and $12_2$ is the same because the direction of the spin currents that flow in is the same.

In the case where the thermal spin-wave spin current generating member 11 in this element shown in FIG. 2 is extremely short in the direction of the temperature gradient and has approximately the same length as the thickness, and at the same time one of the inverse spin Hall effect members $12_1$ and $12_2$ is removed and the rest is rotated by 90°, a thermoelectric conversion element that is equivalent to that shown in FIG. 1 is gained. In the case where the inverse spin Hall effect member $12_2$ is removed, a thermoelectric conversion element that is equivalent to that in FIG. 1(b) is gained, while in the case where the inverse spin Hall effect member $12_1$ is removed, a thermoelectric conversion element that is equivalent to that in FIG. 1(c) is gained.

Any magneto-dielectric body that contains Fe or Co may be used, and it is desirable to use garnet ferrite; spinel ferrite that can be represented by: $Mn_xZn_{1-x}Fe_2O_4$ (0<x<1); hexagonal ferrite, in particular YIG (yttrium iron garnet) or yttrium gallium iron garnet, which are easily available and have small dissipation in the spin angular momentum, that is to say garnet ferrite that can be represented by a general formula: $Y_3Fe_{5-x}Ga_xO_{12}$ (0☐x<5); or garnet ferrite where some Y in YIG is substituted to other atoms, such as La, for example, $LaY_2Fe_5O_{12}$. This is because $Y_3Fe_{5-x}Ga_xO_{12}$ has a large charge gap with very few conduction electrons, and accordingly dissipation in the spin angular momentum due to the conduction electrons is small. Here, an inexpensive material, such as conventional ferrite $Fe_3O_4$, is desirable from the point of view of cost.

Typical examples of antiferromagneto-dielectric bodies are nickel oxide and FeO, and the majority of magneto-dielectric bodies are antiferromagneto-dielectric bodies. In the case where the magneto-dielectric layer is formed of an antiferromagnetic dielectric material, it is desirable to provide an antiferromagnetic layer in order to fix the direction of magnetization of the magneto-dielectric layer.

In the case where a conductive magnetic body is used instead of a magneto-dielectric body, an inverse spin Hall effect member is joined to the conductive magnetic body where no thermoelectromotive force is generated in the structure and electrical mitigation takes place between the two, and therefore it becomes very difficult to take out a thermoelectromotive force from the inverse spin Hall effect member.

As for the method for growing the magneto-dielectric layer, any of a sputtering method, an MOD method (metal-organic decomposition method), a sol-gel method, a liquid phase epitaxy method, a floating zone method and an aerosol deposition method (see Patent Document 4) may be used. In addition, as for the crystallinity, the magneto-dielectric layer may be of a single crystal or polycrystal.

In the case where an MOD method is used, an MOD solution having a $Y_3Fe_4GaO_{12}$ composition, for example, is applied to a GGG ($Gd_3Ga_5O_{12}$) single crystal substrate having a {100} surface as the main surface in accordance with a spin coating method. As for the conditions for spin coating in this case, first the substrate is rotated at 500 rpm for five seconds followed by rotations at 3000 to 4000 rpm for 30 seconds so that the MOD solution is uniformly applied in order for the film thickness after baking to become 100 nm. Here, an example of the MOD solution is an MOD solution made by Kojundo Chemical Laboratory, Co., Ltd.

Next, the substrate is dried on top of a hot plate heated at 150° C. for five minutes so that the extra organic solvent included in the MOD solution is vaporized. Then, the substrate is heated and baked at 550° C. for five minutes in an electric furnace so that the MOD solution is converted to an oxide layer.

Next, the oxide layer is heated and baked in an electric furnace for one to two hours at 750° C. and is further crystallized so as to be converted to a YIG layer. Finally, the YIG layer is cut into pieces of a predetermined size, and then an inverse spin Hall effect member, such as a Pt electrode, is provided on a YIG layer in accordance with a mask sputtering method so that a thermoelectric conversion element is gained.

In the case where an aerosol deposition method is used, an aerosol powder having 50 mol % of $Fe_2O_3$, 27 mol % of NiO and 23 mol % of ZnO having an average particle diameter of 1 μm, for example, is prepared, and an Ar gas, which is a carrier gas, is made to flow at 1000 sccm through a nozzle having an opening of 0.4 mm×10 mm so as to be sprayed against the substrate so that a layer is deposited.

It is desirable to use any of Pt, Au, Pd, Ag, Bi, transition metal elements having an f orbital or a 3d orbital, alloys of these, and alloys of any of these materials and Cu, Al or Si to make the inverse spin Hall effect member. These elements have a large spin-orbit interaction, and therefore the thermal spin-wave spin current and the pure spin current can be exchanged at high efficiency in the interface between the inverse spin Hall effect member and a magneto-dielectric body Here, alloys of any of the above-described materials and Cu, Al or Si are desirable from the point of view of cost.

Example 1

Figure 3:
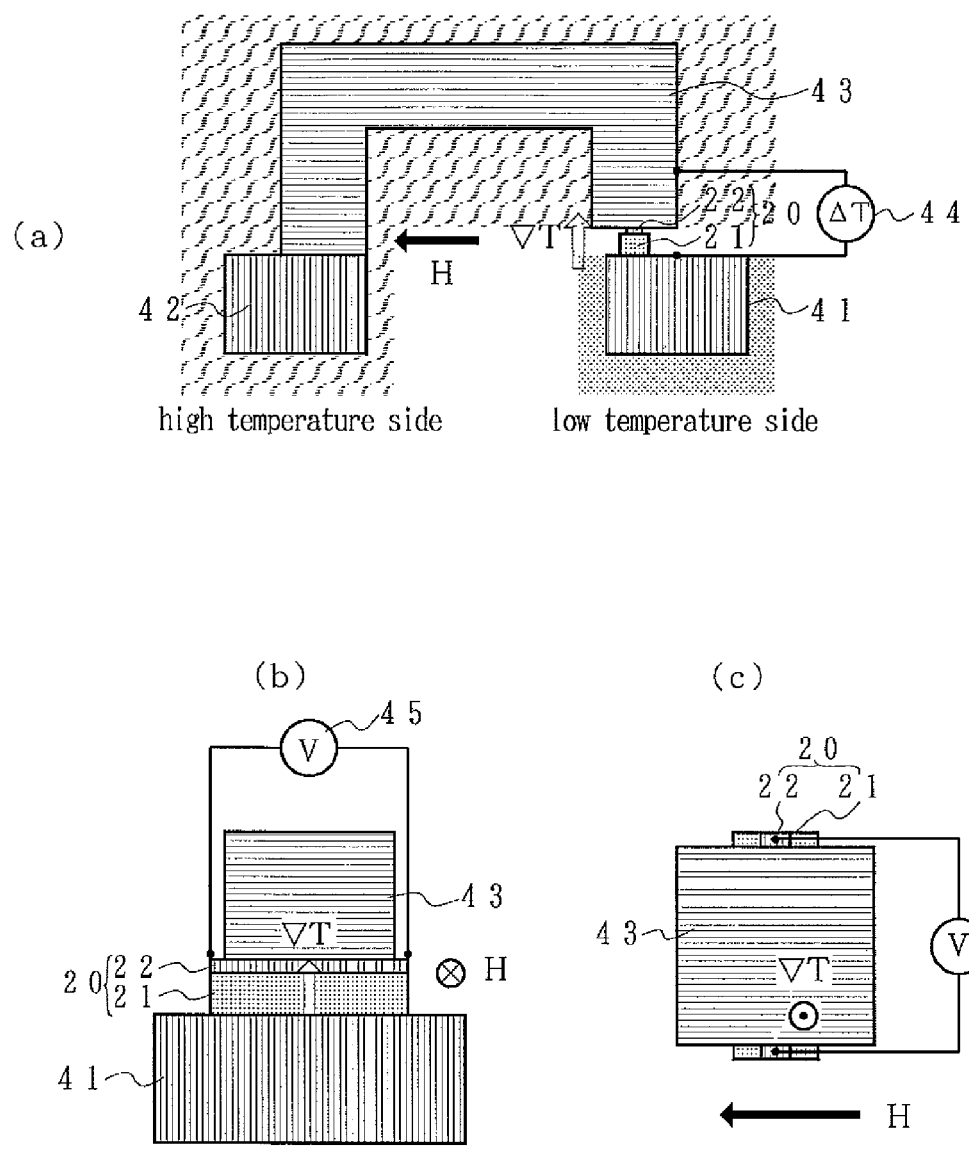
FIGS. 3(a) to 3(c) are diagrams showing the structure in the case where the Pt electrode side is the high temperature side.
Figure 4:
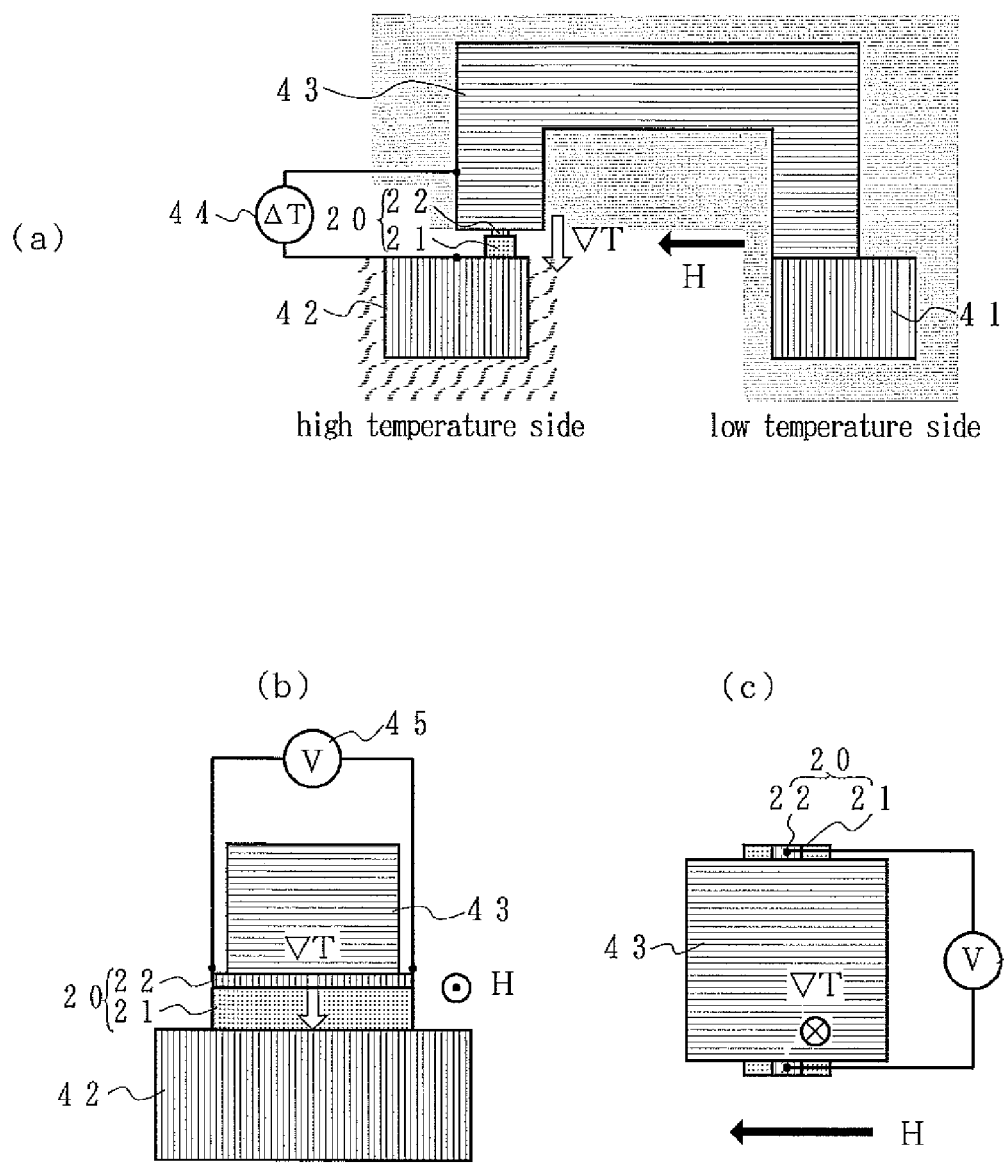
FIGS. 4(a) to 4(c) are diagrams showing the structure in the case where the Pt electrode side is the low temperature side.

Here, the thermoelectric conversion device according to Example 1 of the present invention is described in reference to FIGS. 3(a) to 5(b). FIGS. 3(a) to 3(c) are diagrams showing the structure in the case where the Pt electrode side, which is the inverse spin Hall effect member side, is the high temperature side, where FIG. 3(a) is a schematic front diagram, FIG. 3(b) is a schematic side diagram, and FIG. 3(c) is a top diagram showing a main portion in the vicinity of the thermoelectric conversion element.

A thermoelectric conversion element 20 made of a single crystal YIG plate 21 and a Pt electrode 22 is secured to the top of a Cu block 41 and thermally connected to a Cu block 42 that makes contact with the heat source through a heat conveying member 43 in C shape made of brass. Thus, the temperature gradient ∇T is in the upward direction. Here, an external magnetic field H is applied in the direction perpendicular to the longitudinal direction of the Pt electrode and perpendicular to the temperature gradient ∇T (to the left in the figure).

Here, the size of the YIG plate 21 is 1 mm (thickness)×2 mm (width)×6 mm (length), while the size of the Pt electrode is 15 nm (thickness), 0.5 mm (width) and 6 mm (length). At this time, the difference in the temperature ΔT is measured by a thermocouple 44 and the thermoelectromotive force generated in the Pt electrode 22 in the longitudinal direction is measured by a voltmeter 45.

FIGS. 4(a) to 4(c) are diagrams showing the structure in the case where the Pt electrode side, which is the inverse spin Hall effect member side, is the low temperature side, where FIG. 4(a) is a schematic front diagram, FIG. 4(b) is a schematic side diagram, and FIG. 4(c) is a top diagram showing a main portion in the vicinity of the thermoelectric conversion element.

A thermoelectric conversion element 20 made of a single crystal YIG plate 21 and a Pt electrode 22 is secured to the top of a Cu block 42 that makes contact with the heat source and thermally connected to a Cu block 41 through a heat conveying member 43 in C shape made of brass. Thus, the temperature gradient ∇T is in the downward direction. Here, as in FIG. 3, an external magnetic field H is applied in the direction perpendicular to the longitudinal direction of the Pt electrode and perpendicular to the temperature gradient ∇T (to the left in the figure). The difference in the temperature ∇T is measured by a thermocouple 44 and the thermoelectromotive force generated in the Pt electrode 22 in the longitudinal direction is measured by a voltmeter 45.

FIGS. 5(a) and 5(b) are graphs showing the results of the measurement, where FIG. 5(a) shows the results of measurement for the structure in FIGS. 3(a) to 3(c) and FIG. 5(b) shows the results of measurement for the structure in FIGS. 4(a) to 4(c). As shown in FIGS. 5(a) and 5(b), in either case, an electromotive force of approximately 15 μV was gained under such conditions that H=1000 [Oe] and the difference in the temperature ΔT=20° C. Here, in the case where the external magnetic field H is applied to the Pt electrode 22 in the longitudinal direction, that is to say, in the case of θ=0°, an electromotive force is generated in the Pt electrode 22 in the direction of the width, and therefore no electromotive force can be taken out from the structure shown in the figures.

Example 2

Figure 6:
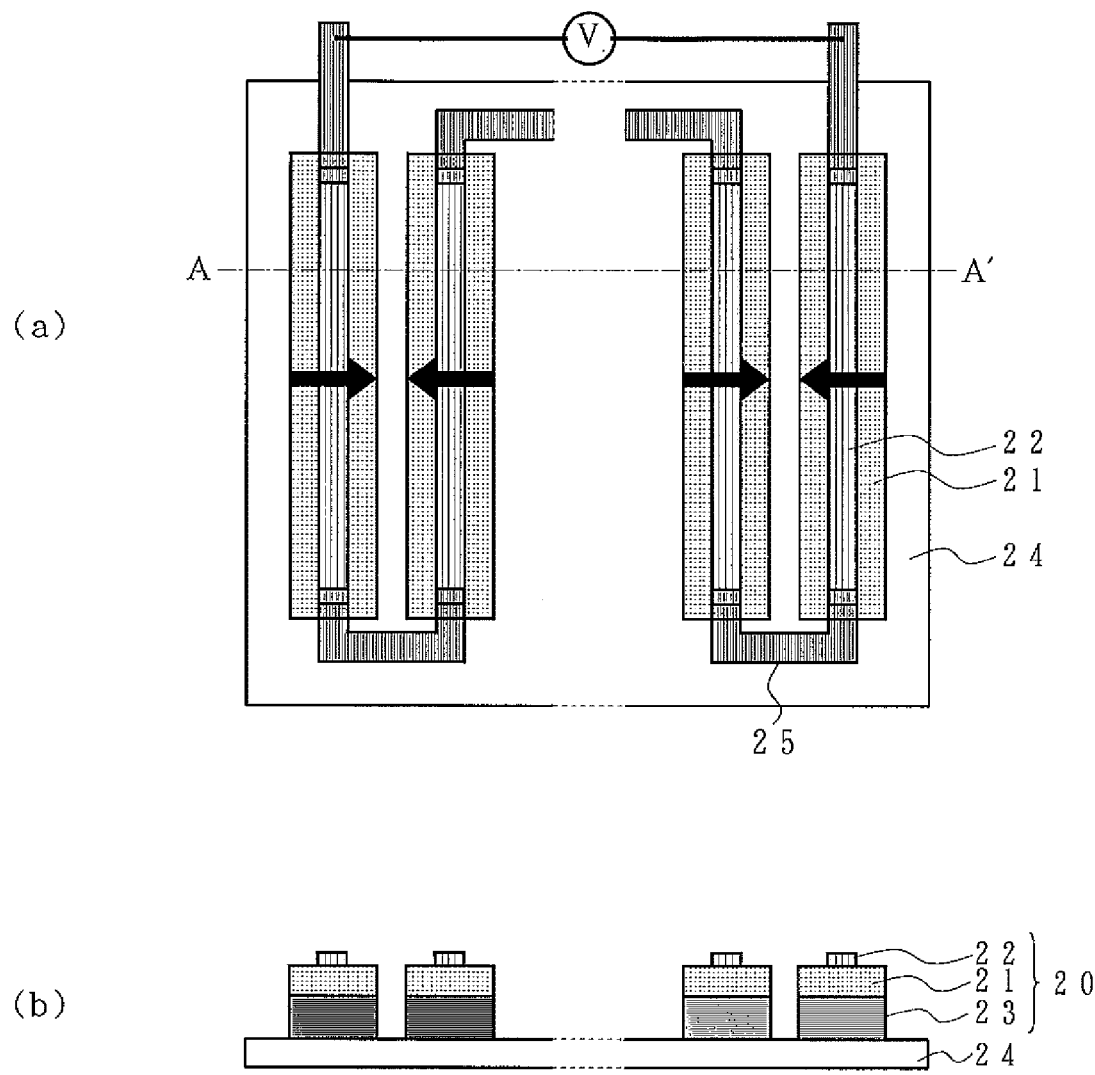
FIGS. 6(a) and 6(b) are schematic diagrams showing the structure of the thermoelectric conversion device according to Example 2 of the present invention.

Next, the thermoelectric conversion device according to Example 2 of the present invention is described in reference to FIGS. 6(a) and 6(b). FIGS. 6(a) and 6(b) are schematic diagrams showing the structure of the thermoelectric conversion device according to Example 2 of the present invention, where FIG. 6(a) is a schematic plan diagram and FIG. 6(b) is a schematic cross-sectional diagram along the single dotted chain line A-A' in FIG. 6(a). A magnetized IrMn antiferromagnetic plate 23 is pasted to the rear surface of the YIG plate 21 of the above-described thermoelectric conversion element 20 made of a YIG plate 21 and a Pt electrode 22. At this time, the direction M of magnetization of the IrMn antiferromagnetic plate 23 is perpendicular to the longitudinal direction of the Pt electrode 22.

The same thermoelectric conversion elements as this thermoelectric conversion element 20 are alternately aligned on a flexible sheet 24, such as a PET sheet, so that the directions M of magnetization are opposite to each other and the Pt electrode 22 of each thermoelectric conversion element 20 is connected to the Pt electrode 22 of an adjacent thermoelectric conversion element 20 through a Cu connection conductor 25, and thus the thermoelectric conversion elements are connected in sequence.

The flexible sheet 24 is made to come into close contact with a heat source, and the Pt electrode 22 side is cooled by means of air or water so that a thermoelectromotive force can be taken out. At this time, the thermoelectromotive force $V_{tot}$ can be represented by $$V_{tot} = n \times V$$

where n is the number of thermoelectric conversion elements 20 and V is the thermoelectromotive force of one thermoelectric conversion element 20.

Example 3

Figure 7:
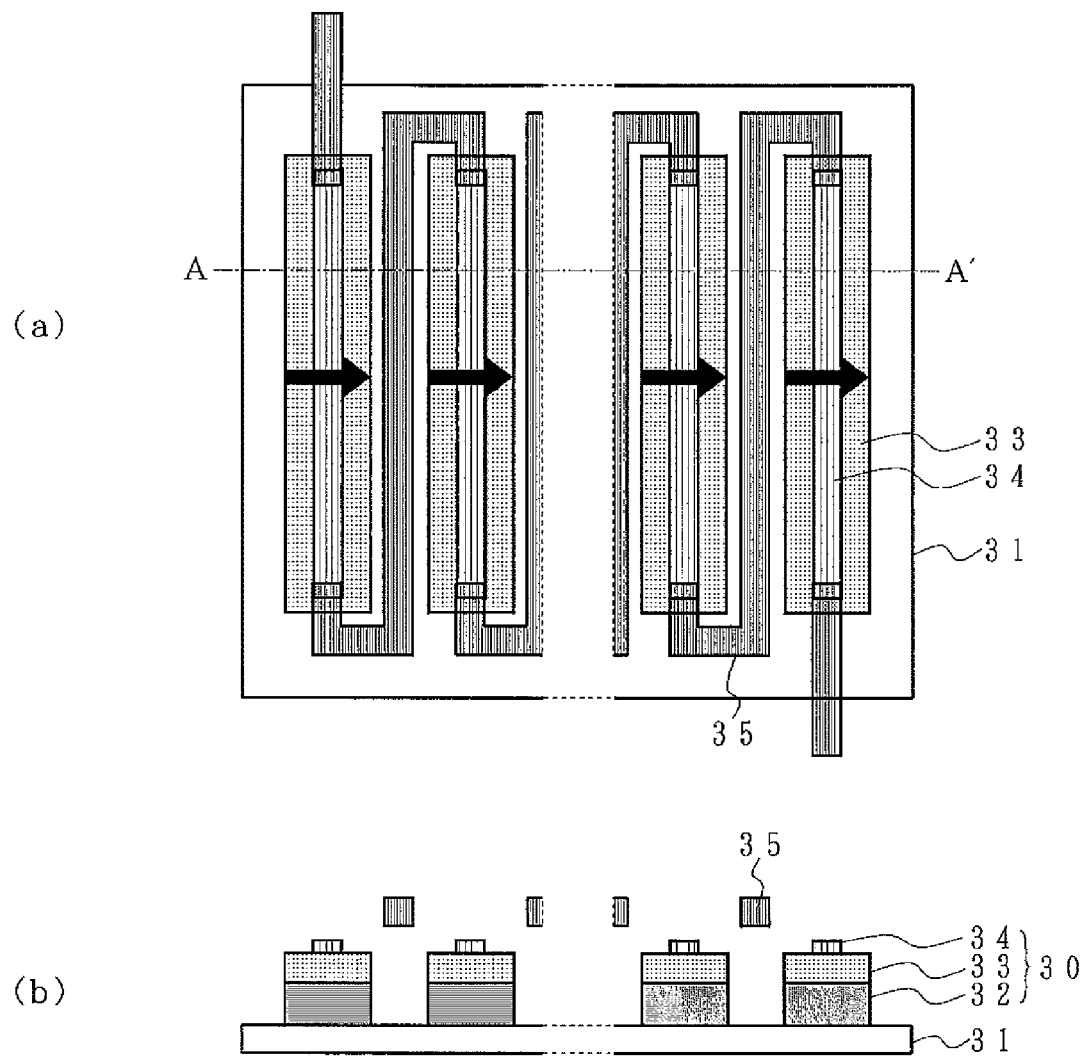
FIGS. 7(a) and 7(b) are schematic diagrams showing the structure of the thermoelectric conversion device according to Example 3 of the present invention.

Next, the thermoelectric conversion device according to Example 3 of the present invention is described in reference to FIGS. 7(a) and 7(b). FIGS. 7(a) and 7(b) are schematic diagrams showing the structure of the thermoelectric conversion device according to Example 3 of the present invention, where FIG. 7(a) is a schematic plan diagram and FIG. 7(b) is a schematic cross-sectional diagram along the single dotted chain line A-A in FIG. 7(a).

An IrMn antiferromagnetic layer 32 is deposited in lines with spaces in between on a heat-resistant flexible sheet 31, such as a heat-resistant glass fiber sheet, in accordance with a mask sputtering method. At this time, an external magnetic field is applied so that the IrMn antiferromagnetic layer 32 is magnetized in the direction of the external magnetic field.

Next, $Fe_3O_4$ is selectively deposited on the IrMn antiferromagnetic layer 32 in accordance with an aerosol deposition method so as to form a magneto-dielectric layer 33. Then, Pt electrodes 34 are formed on the magneto-dielectric layer 33 in accordance with a mask vapor deposition method, and thus thermoelectric conversion elements 30 are gained.

Next, one end of the Pt electrode 34 of each thermoelectric conversion element 30 is connected to the other end of the Pt electrode 34 of an adjacent thermoelectric conversion element 30 through a Cu connection conductor 35 so that the thermoelectric conversion elements 30 are connected in sequence. The heat-resistant flexible sheet is made to come into close contact with a heat source, and the Pt electrode 34 side is cooled by means of air or water so that a thermoelectromotive force can be taken out. At this time as well, the thermoelectromotive force $V_{tot}$ can be represented by $$V_{tot} = n \times V$$

where n is the number of thermoelectric conversion elements 30 and V is the thermoelectromotive force of one thermoelectric conversion element 30. In this case, the magneto-dielectric layer 33 in the thermoelectric conversion elements 30 is magnetized in the same direction, and therefore the magneto-dielectric layer 33 may be magnetized by means of an external magnetic field without using the IrMn antiferromagnetic layer 32.

Example 4

Next, the thermoelectric conversion device according to Example 4 of the present invention is described in reference to FIGS. 8(a) and 8(b). FIGS. 8(a) and 8(b) are schematic diagrams showing the structure of the thermoelectric conversion device according to Example 4 of the present invention, where FIG. 8(a) is a schematic plan diagram and FIG. 8(b) is a schematic cross-sectional diagram along the single dotted chain line A-A' in FIG. 8(a). Pt electrodes $22_1$ and $22_2$ are mask vapor deposited on a pair of facing main surfaces of the above-described YIG plate 21 so that a thermoelectric conversion element 26 is formed.

The same thermoelectric conversion elements as this thermoelectric conversion element 26 are layered on top of each other with non-magnetic insulators 27, such as of $SiO_2$ or an insulating resin, in between, and one end of each Pt electrode $22_1$ is connected to the other end of the Pt electrode $22_2$ located above the Pt electrode $22_1$ through a Cu connection conductor 28 so that the thermoelectric conversion elements are connected in sequence, and thus a thermoelectric conversion device is fabricated.

The temperature gradient $\nabla T$ is provided to this thermoelectric conversion device in the direction in which the thermoelectric conversion elements are layered, and at the same time an external magnetic field H is applied in the direction perpendicular to the longitudinal direction of the Pt electrodes $22_1$ and $22_2$ and perpendicular to the temperature gradient $\nabla T$ when pure spin currents $J_S$ are injected into the two Pt electrodes $22_1$ and $22_2$ from the interfaces between the one YIG plate 21 and the Pt electrodes $22_1$ and $22_2$ on the two sides in the direction shown by the arrows in the figure, and they are converted to electromotive forces as a result of an inverse spin Hall effect in the Pt electrodes $22_1$ and $22_2$.

Accordingly, the thermoelectromotive force generated per thermoelectric conversion element is two times greater than the thermoelectromotive force of the thermoelectric conversion element in FIGS. 1(a) to 1(c), and therefore the thermoelectromotive force $V_{tot}$ can be represented by $$V_{tot} = n \times (2 \times V)$$

where n is the number of thermoelectric conversion elements 26.

Example 5

Figure 9:
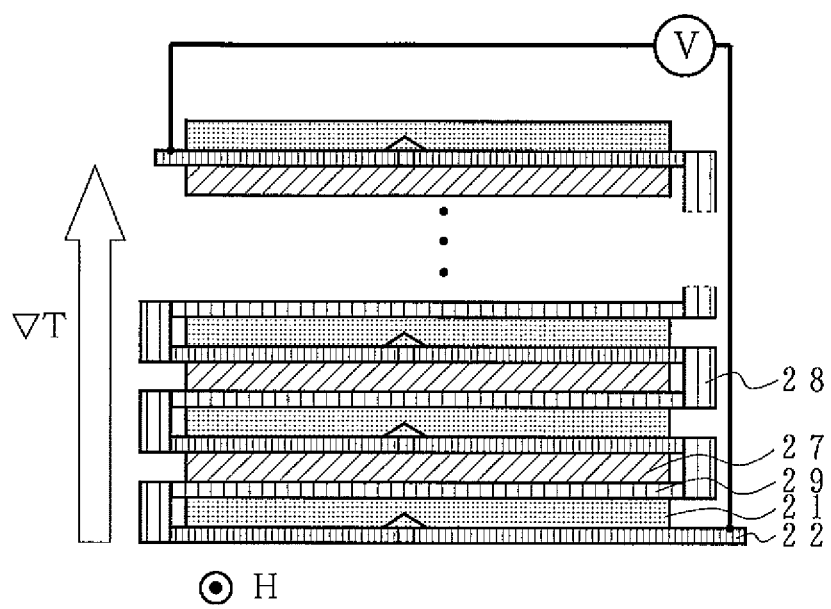
FIG. 9 is a schematic diagram showing the structure of the thermoelectric conversion device according to Example 5 of the present invention.

Next, the thermoelectric conversion device according to Example 5 of the present invention is described in reference to FIG. 9. FIG. 9 is a schematic diagram showing the structure of the thermoelectric conversion device according to Example 5 of the present invention. Multilayer bodies where a YIG plate 21 is sandwiched between a PT electrode 22 and a paramagnetic conductor 29 having a small spin-orbit interaction, such as Cu, are layered on top of each other with non-magnetic insulators 27, such as of $SiO_2$ or an insulating resin, in between so that an end of each Pt electrode 22 is connected to an end of the paramagnetic conductor 29 located above the Pt electrode 22 through a Cu connection conductor 28 in order for the multilayer bodies to be connected in series, and thus a thermoelectric conversion device is fabricated.

A temperature gradient $\nabla T$ is provided to this thermoelectric conversion device in the direction in which the multilayer bodies are layered, and at the same time an external magnetic field H is applied in the direction perpendicular to the longitudinal direction of the Pt electrodes 22 and perpendicular to the temperature gradient $\nabla T$ when a pure spin currents $J_S$ is injected from the interface between each YIG plate 21 and the Pt electrode 22 in the direction shown by the arrows in the figure, and this is converted to an electromotive force as a result of an inverse spin Hall effect in the Pt electrodes $22_1$ and $22_2$. The paramagnetic conductors 29 are made of a substance having a small spin-orbit interaction, and therefore no thermoelectromotive force is generated in the paramagnetic conductors 29 as a result of an inverse spin Hall effect.

Accordingly, the thermoelectromotive force generated per thermoelectric conversion element is the same as that of the thermoelectric conversion element in FIGS. 1(a) to 1(c), and therefore the thermoelectromotive force $V_{tot}$ can be represented by $$V_{tot} = n \times V$$

where n is the number of the multilayer bodies. In this case, the thermoelectromotive force is half of that in the above-described Example 4, but it is easy to electrically connect the multilayer bodies to each other.

Example 6

Next, the thermoelectric conversion device according to Example 6 of the present invention is described in reference to FIG. 10(a) to FIG. 11(b). FIGS. 10(a) to 10(c) are diagrams showing the structure of the thermoelectric conversion device according to Example 6 of the present invention, where FIG. 10(a) is a schematic front diagram, FIG. 10(b) is a schematic side diagram, and FIG. 10(c) is a top diagram showing a main portion in the vicinity of the thermoelectric conversion element. Here, as in FIGS. 4(a) to 4(c), a case where the Pt electrode side, which is the inverse spin Hall effect member side, is the low temperature side is described, but the Pt electrode side, which is the inverse spin Hall effect member side, may be the high temperature side as in FIGS. 3(a) to 3(c).

A thermoelectric conversion element 60 made of an $Mn_{0.75}Zn_{0.25}Fe_2O_4$ plate 61, which is made of a sintered body, and a Pt electrode 62 is secured to the top of a Cu block 42 that makes contact with a heat source and thermally connected to a Cu block 41 through a heat conveying member 43 in C shape made of brass and an $Al_2O_3$ plate 63. Thus, the temperature gradient $\nabla T$ is in the downward direction.

Here, as in FIGS. 4(a) to 4(c), an external magnetic field H is applied in the direction perpendicular to the longitudinal direction of the Pt electrode 62 and in the direction perpendicular to the temperature gradient $\nabla T$ (to the left in the figure), and the difference in the temperature $\Delta T$ is measured by the thermocouple 44, and at the same time the thermoelectromotive force generated in the Pt electrode 62 in the longitudinal direction is measured by a voltmeter 45.

Here, the size of the $Mn_{0.75}Zn_{0.25}Fe_2O_4$ plate 61 is 1 mm (thickness)×2 mm (width)×6 mm (length) and the size of the Pt electrode 62 is 15 nm (thickness)×0.5 mm (width)×6 mm (length). In addition, the size of the $Al_2O_3$ plate 63 is 0.5 mm (thickness)×5 mm (width)×5 mm (length), and this is intervened in order to electrically insulate the thermoelectric conversion element 60 from the heat conveying member 43 during the measurement of the electromotive force and may not be made of $Al_2O_3$ as long as it is an insulator having high thermal conductivity FIGS. 11(a) and 11(b) are graphs illustrating the results of measurement, where FIG. 11(a) is a graph showing the entire relationship between the thermoelectromotive force V and the difference in the temperature $\Delta T$, and an electromotive force of approximately 2 µV was gained under such conditions that H=1000 [Oe] and the difference in the temperature $\Delta T$=15° C. In the case where an external magnetic field H is applied in the longitudinal direction of the Pt electrode 62, that is to say, in the case of θ=0°, the electromotive force is generated in the direction of the width of the Pt electrode 22, and therefore no electromotive force can be taken out from the structure shown in the figure.

FIG. 11(b) is a graph illustrating the dependency of the thermoelectromotive force on the difference in the temperature in the case where the external magnetic field is swept, where the lower side lines are characteristic curves in the case where the external magnetic field is swept from negative to positive and the upper side lines are characteristic curves in the case where the external magnetic field is swept from positive to negative.

As is clear from the graphs, a clear hysteresis loop appears for any difference in the temperature ΔT, and therefore it can be seen that the observed electromotive force is inversed as a result of the inversion of magnetization of the $Mn_{0.75}Zn_{0.25}Fe_2O_4$ plate 61, that is to say, adjusts to the symmetry in the inverse spin Hall effect.

Here, the $Mn_{0.75}Zn_{0.25}Fe_2O_4$ plate in this Example 6 has a smaller thermoelectromotive force than YIG, and this is considered to be because magnons are scattered in the sintered body, that is to say, from the interfaces between microcrystals, and at the same time magnetic loss (relaxation constant α) is much greater than that in YIG. Here, though in Example 6, $(MnZn)Fe_2O_4$ having a composition ratio of Mn:Zn=3:1 is used, other composition ratios are possible.

EXPLANATION OF SYMBOLS

11 thermal spin-wave spin current generating member
12, 12₁, 12₂ inverse spin Hall effect member
20, 60 thermoelectric conversion element
21 YIG plate
22, 22₁, 22₂, 62 Pt electrode
23 IrMn antiferromagnetic plate
24 flexible sheet
25, 28 Cu connection conductor
26 thermoelectric conversion element
27 non-magnetic insulator
29 paramagnetic conductor
30 thermoelectric conversion element
31 heat-resistant flexible sheet
32 IrMn antiferromagnetic layer
33 magneto-dielectric layer
34 Pt electrode
35 Cu connection conductor
41, 42 Cu block
43 heat conveying member
44 thermocouple
45 voltmeter
51 magneto-dielectric layer
52, 53 non-magnetic conductor
61 $Mn_{0.75}Zn_{0.25}Fe_2O_4$ plate
63 $Al_2O_3$ plate

What is claimed is:

1. A thermoelectric conversion element, comprising:
   a thermal spin-wave spin current generating member made of a magneto-dielectric body having a first surface and a second surface positioned opposite to the first surface, between the first surface and the second surface being a smallest dimension;
   an inverse spin Hall effect member formed on the first surface of the thermal spin-wave spin current generating member;
   a heat source and a low temperature part to provide a temperature gradient between the first surface and the second surface in said thermal spin-wave spin current generating member, the low temperature part being a solid cooling member or liquid cooling medium, the temperature gradient being determined by a first temperature of the first surface and a second temperature of the second surface such that the temperature gradient continuously increases or decreases from the first surface to the second surface; and
   a magnetic field generator to apply a magnetic field to said inverse spin Hall effect member in the direction perpendicular to a longitudinal direction of the inverse spin Hall effect member and perpendicular to the direction of said temperature gradient,
   wherein a thermal spin-wave spin current is converted to a voltage which is taken out in said inverse spin Hall effect member.

2. The thermoelectric conversion element according to claim 1, wherein said magneto-dielectric body is made of any of a ferrimagnetic dielectric material, a ferromagnetic dielectric material or antiferromagnetic dielectric material.

3. The thermoelectric conversion element according to claim 1, wherein said magneto-dielectric body is made of a ferrimagnetic dielectric material or a ferromagnetic dielectric material, and at the same time said magnetic field generator is an antiferromagnetic layer that makes contact with said magneto-dielectric body so as to fix the direction of magnetization of said magneto-dielectric body.

4. The thermoelectric conversion element according to claim 1, wherein said magneto-dielectric body is made of any of garnet ferrite, spinel ferrite or hexagonal ferrite.

5. The thermoelectric conversion element according to claim 4, wherein said magneto-dielectric body is made of garnet ferrite represented by $Y_3Fe_{5-x}Ga_xO_{12}$ (0≤x<5).

6. The thermoelectric conversion element according to claim 4, wherein said magneto-dielectric body is made of spinel ferrite represented by $Mn_xZn_{1-x}Fe_2O_4$ (0<x<1).

7. The thermoelectric conversion element according to claim 1, wherein said inverse spin Hall effect member is made of any of Pt, Au, Pd, Ag, Bi, elements having an f orbital, transition metal elements having a 3d orbital, alloys of these, and alloys of any of said materials and Cu, Al or Si.

8. A thermoelectric conversion device, wherein a number of thermoelectric conversion elements, which are the same as the thermoelectric conversion element according to claim 1, are aligned alternately so that the direction of magnetization is opposite to each other, and at the same time the ends of the inverse spin Hall effect members are connected to each other so that the thermoelectromotive forces are connected in series.

9. A thermoelectric conversion device, comprising a plurality of thermoelectric conversion elements, each of which is the conversion element according to claim 1, wherein the conversion elements are aligned so that the direction of magnetization is the same, and at the same time the ends of the inverse spin Hall effect members are connected to each other so that the thermoelectromotive forces are connected in series.

10. A thermoelectric conversion device, wherein the two sides or one side of a thermal spin-wave spin current generating member made of a magneto-dielectric body is provided with an inverse spin Hall effect member so that a thermoelectric conversion element is formed, a number of thermoelectric conversion elements, which are the same as said thermoelectric conversion element, are layered on top of each other with non-magnetic insulators in between, and at the same time the ends of said inverse spin Hall effect members are connected to each other so that the thermoelectromotive forces are connected in series, a temperature gradient is provided to said thermoelectric conversion elements in the direction in which said thermoelectric conversion elements are layered, and a magnetic field is applied to said inverse spin Hall effect elements in the direction perpendicular to the longitudinal direction and perpendicular to the direction of said temperature gradient by means of a magnetic field applying means, and thus a thermal spin-wave spin current is converted to a voltage which is taken out in said inverse spin Hall effect members.

* * * * *